(12) United States Patent
Frosien et al.

(10) Patent No.: US 6,459,283 B1
(45) Date of Patent: Oct. 1, 2002

(54) METHOD AND SYSTEM FOR TESTING AN ELECTRICAL COMPONENT

(75) Inventors: Jürgen Frosien, Riemerling; Reinhold Schmitt, München, both of (DE)

(73) Assignee: Advantest Corp., Tokyo (JP)

( * ) Notice: Subject to any disclaimer, the term of this patent is extended or adjusted under 35 U.S.C. 154(b) by 41 days.

(21) Appl. No.: 09/607,816

(22) Filed: Jun. 30, 2000

(30) Foreign Application Priority Data

Jul. 29, 1999 (EP) .............................. 99114850

(51) Int. Cl.[7] .......................................... G01R 31/302
(52) U.S. Cl. ...................... 324/750; 324/751; 324/71.3; 250/310
(58) Field of Search ................ 324/71.3, 750, 324/751, 752, 753; 250/310, 306

(56) References Cited

U.S. PATENT DOCUMENTS

| | | | | |
|---|---|---|---|---|
| 4,355,232 A | * | 10/1982 | Todokoro et al. ........... | 250/310 |
| 4,843,330 A | * | 6/1989 | Golladay et al. ........... | 324/751 |
| 4,912,052 A | * | 3/1990 | Miyoshi et al. ............. | 324/751 |
| 4,954,773 A | * | 9/1990 | Brust .......................... | 324/751 |
| 5,444,384 A | * | 8/1995 | Lackmann et al. ......... | 324/751 |
| 5,602,489 A | | 2/1997 | El-Kareh et al. | |

* cited by examiner

*Primary Examiner*—Michael Sherry
*Assistant Examiner*—Minh N. Tang
(74) *Attorney, Agent, or Firm*—Muramatsu & Associates

(57) ABSTRACT

A method and a system for testing an electrical component in a non-contact manner at high speed with high reliability. The method includes the steps of positioning a primary particle beam onto the component, supplying an AC-signal to the electrode being positioned in front of the component and varying the frequency of the AC-signal, detecting secondary particles released at the component and penetrating the electrode to form a secondary particle signal, and evaluating the corresponding secondary particle signal.

9 Claims, 4 Drawing Sheets

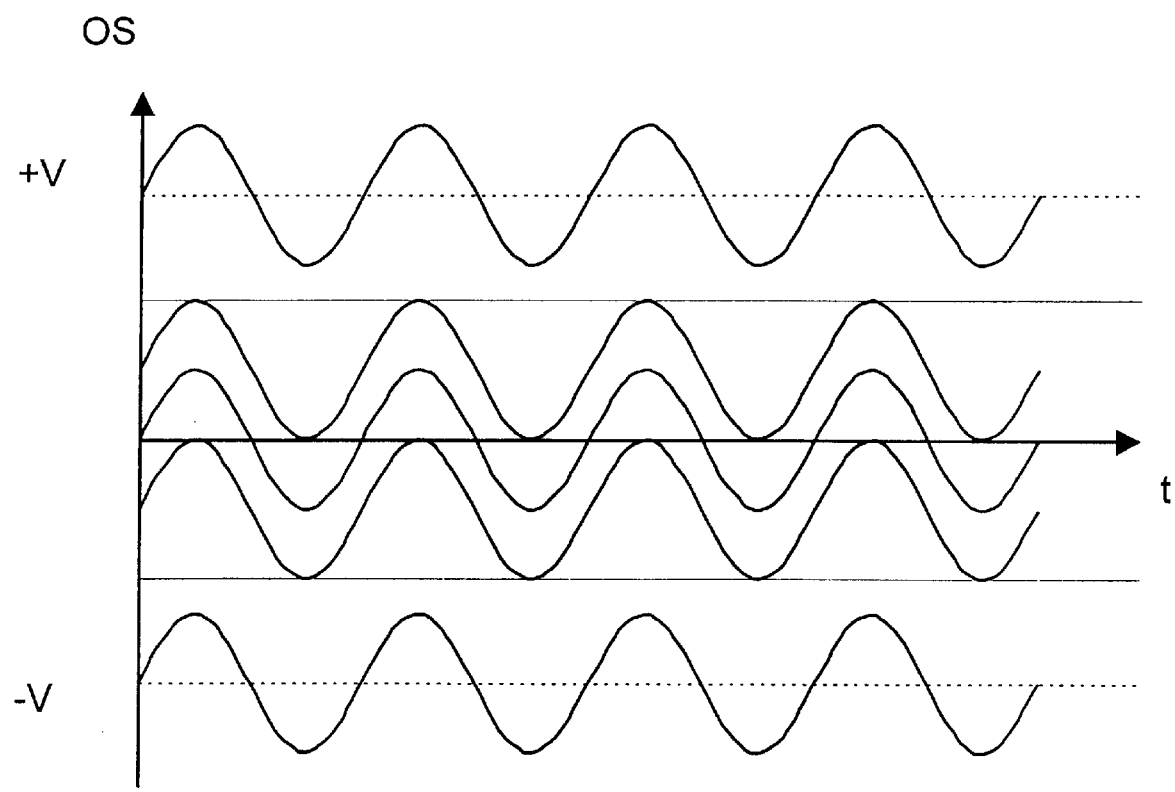
Fig: 5

METHOD AND SYSTEM FOR TESTING AN ELECTRICAL COMPONENT

FIELD OF THE INVENTION

The invention relates to a method and a system for testing an electrical component.

BACKGROUND OF THE INVENTION

Electrical components, such as networks of printed circuit boards or integrated circuits, have to be tested with respect to their electrical properties. These measurements comprise, for instance, the capacitance, RC-constants, opens and/or shorts of the component.

A conventional method of capacitance measurement is the application of an electrical C-measurement bridge, in which the contact to the component to be measured is performed by mechanical probes.

It is also known to use a particle beam for contactless measurement of shorts and/or opens. In this technique a network is charged up and the potential distribution along the network and on adjacent networks is measured by contactless potential measurement techniques, e.g. by the energy analysis of released secondary particles. This technique gives detailed local information about shorts and opens, but a capacitance- or RC-measurement cannot be performed.

U.S. Pat. No. 5,602,489 describes a method for testing the interconnect networks of a multichip module for opens and shorts. It comprises the steps of:

maintaining an extract grid at a first grid potential;
defining a potential on a pad such that the pad and the extract grid reach a first state;
switching the extract grid to a second grid potential;
maintaining the extract grid and the second grid potential until the pad and the extract grid reach a second state; and
measuring a test time, in order to determine the capacitance of the interconnect network being tested.

Irregularities in the network (shorts to other networks or opens within one network) will change the capacitance and therefore the test time for reaching the second state. The observation of this charging and recharging process is performed by a detector, which detects the secondary particles passing the extract grid.

Although the method known from the U.S. Pat. No. 5,602,489 is much faster, because only one location of the component has to be measured, it also has some severe drawbacks which limit measurement accuracy and accordingly its applicability. Since the measurement merely relies on a time difference measurement, any variation in the beam current and secondary particle yield will also affect the time difference measurement from the first state to the second state. Beam current variations can be controlled by beam current measurement. Secondary yield changes, however, are difficult to detect. They can be caused by surface contamination, surface roughness, angle of irradiation and so on. Therefore, the measurement contains not necessarily information about the capacitance alone, but includes the effect of many other parameters. Consequently, the method is not reliable.

SUMMARY OF THE INVENTION

It is therefore an object of the invention, to provide a method and a system for testing an electrical component which is fast and provides reliable results.

The method for testing an electrical component according to the invention comprises the steps of:

positioning a primary particle beam onto the component,
supplying an AC-signal to an electrode being positioned in front of the component,
varying the frequency of the AC-signal,
detecting secondary particles released at the component and penetrating the electrode to form a secondary particle signal, and
evaluating the corresponding secondary particle signal.

It is preferred to evaluate the corresponding secondary particle signal with respect to an AC-amplitude variation and/or phase shift relatively to the AC-signal of the electrode.

BRIEF DESCRIPTION OF THE DRAWINGS

Further advantages and embodiments of the invention will be described in greater detail in the following description and the drawings, in which FIG. 5 is a graphical illustration of electrode signals with a different DC-offset.

DETAILED DESCRIPTION OF THE INVENTION

Figure 1:
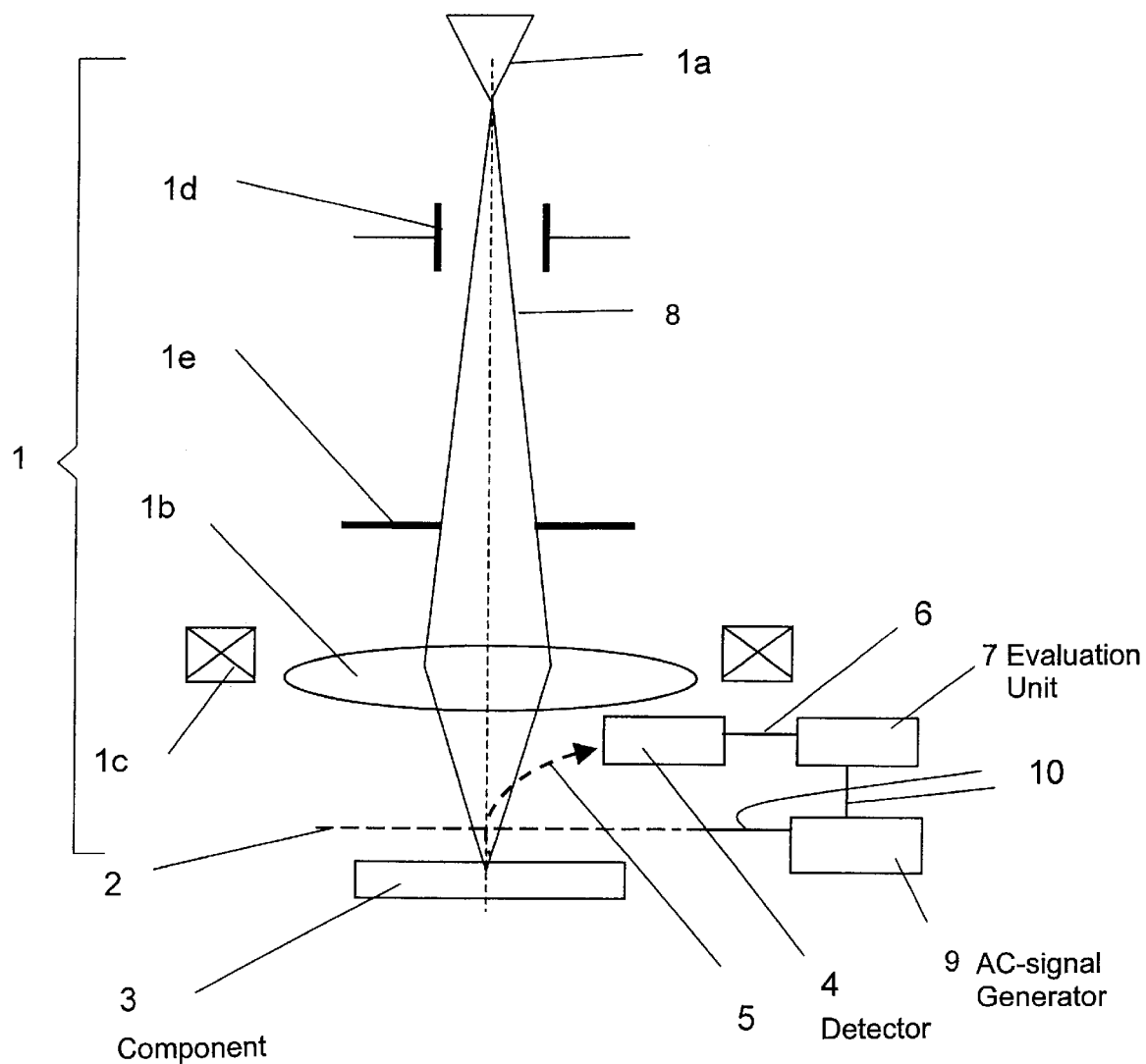
FIG. 1 shows a schematic representation of the system for testing an electrical component.
Figure 2:
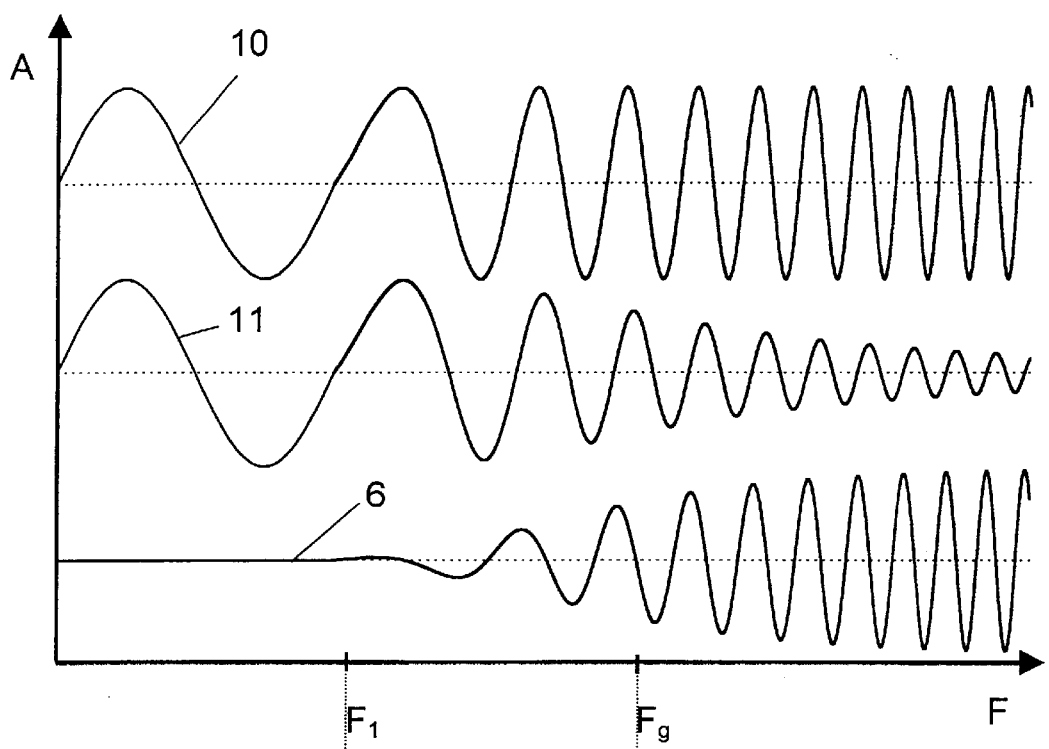
FIG. 2 is a graphical illustration of the frequency variation of electrode signal, component potential and the secondary particle signal.

FIG. 1 shows a system for testing an electrical component 3, especially for determining its capacitance and RC-constants. It comprises a particle beam column 1, an electrode 2 arranged in front of the component 3, a detector (detection means) 4 for detecting secondary particles 5 released at the component 3 and penetrating the electrode 2 to form a secondary particle signal 6 and an evaluation unit (evaluation means) 7 for evaluating the secondary particle signal.

The particle beam column 1 consists of a gun 1a for producing the primary particle beam 8, lenses 1b to generate a particle probe on the component 3 and deflection means 1c to align the primary particle beam 8 in the column and to place and/or scan the probe on the component. For switching the primary particle beam 8 on and off, blanking means 1d are provided. An aperture 1e limits the primary particle beam 8.

Further means like diaphragms, stigmators and so on are not disclosed in detail as they are not relevant for the understanding of the invention.

The electrode 2 is arranged above the component 3 to be measured. An AC-signal generator 9 are provided for applying an AC-signal to the electrode 2 and to vary the frequency of the AC-signal.

The method for testing the electrical component will now be described in more detail:

For the measurement of the capacitance of a component, like a network or an integrated circuit, the primary particle beam 8 is positioned on at least one location of this component 3. At the same time, an AC-signal (electrode signal) 10, having an amplitude A, an offset voltage OS and a frequency F is supplied to the electrode 2 in front of the component 3. The secondary particles 5 released at the component 3 and penetrating the electrode 2 are detected by the detector 4 to form the secondary particle signal (detector signal) 6.

The secondary particle signal 6 and the electrode signal 10 are recorded in synchronism by the evaluation means 7. Since the voltage of the component 3 tries to achieve the electrode potential, also the component potential 11 will follow the applied electrode signal 10. Accordingly, the component potential 11 will have the same frequency as the AC-signal supplied to the electrode 2. A variation of the electrode signal frequency normally will result merely in a variation of the component voltage modulation.

The secondary particle signal 6 detected by the detector 4 is a function of the difference between the electrode signal 10 and the component voltage signal. As long as the component potential 11 can follow the electrode signal 10, the detector signal 6 is constant. As soon as the component potential cannot follow the electrode signal, which is determined and limited by the device capacity, an AC-signal appears which has an increasing amplitude (cf.

FIG. 2).

Figure 3:
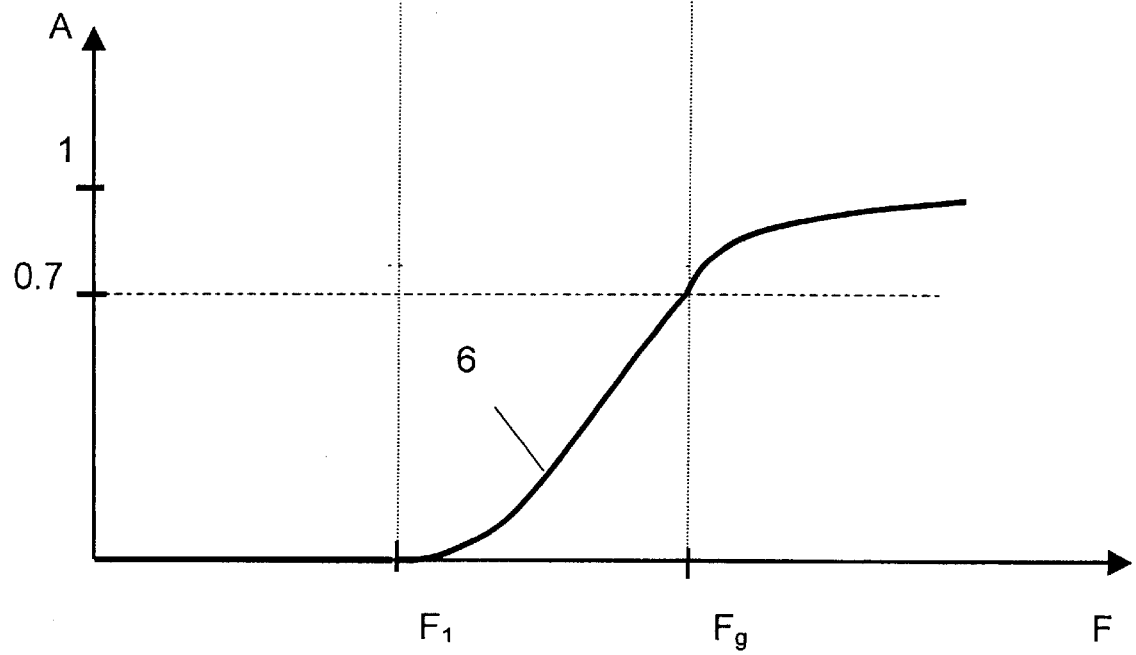
FIG. 3 is a graphical illustration of the amplitude variation of the secondary particle signal.

As soon as the electrode signal frequency becomes so high that component's capacity does not allow to follow the fast signal change (because its capacity is too high), the measured secondary particle signal amplitude is determined by the electrode signal and will start to saturate. FIG. 3 shows the secondary particle signal amplitude as a function of the electrode signal (AC-signal) frequency F. Depending on the component's capacity, the secondary particle signal amplitude starts to increase significantly if the electrode signal frequency F is higher than a certain frequency F1. The capacitance of the component can be determined from the shape of this increase, e.g. frequency Fg which belongs to an increase of the amplitude to 70%.

Figure 4:
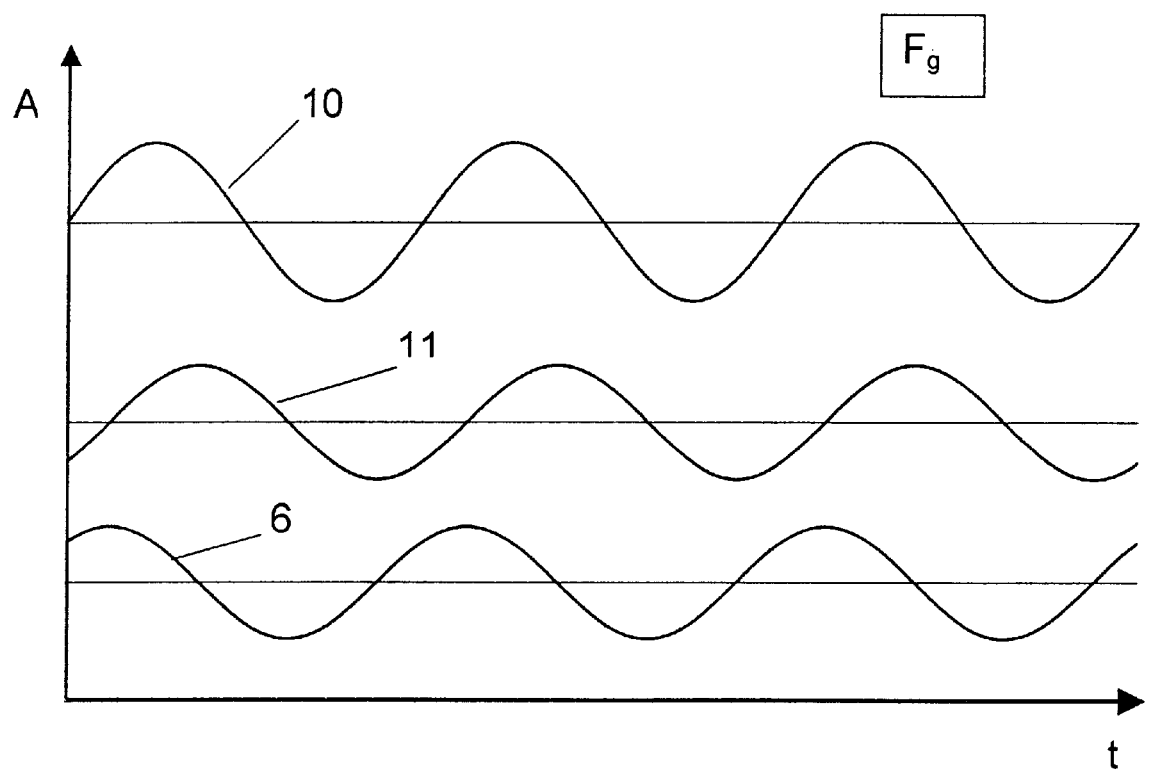
FIG. 4 is a graphical illustration of the phase of the electrode signal, component potential and the secondary particle signal at the frequency Fg

The upcoming secondary particle signal 6 is also phase shifted with respect to the electrode signal 10. It starts with a phase shift of 90°. When the amplitude has increased to 70% of the full amplitude, there is a phase shift of 45° as can be seen in FIG. 4, which shows the phase shift behavior of the component potential 11 and the secondary particle signal 6 relative to the electrode signal 10. Accordingly, either the amplitude variation and/or the phase shift of the secondary particle signal relative to the electrode signal can be used to determine the capacitance and/or RC-constants of the component 3.

The basic procedure of the invention provides for the supply of an AC-signal to the electrode 2 arranged above the component 3 and the registration of the corresponding secondary particle signal. The frequency of the electrode signal is varied (continuously or setting to discrete values) and the corresponding secondary particle signal is recorded and analyzed with respect to AC-amplitude variation and/or phase shift relative to the electrode signal. From one or both information, the capacitance of the component can be determined, e.g. by comparison with measurements of calibrated components. Additionally, the shape of the signal variation as a function of the frequency gives further information about the RC-behavior of the component or network.

To receive a significant secondary particle signal, the amplitude of the electrode signal has to be chosen appropriately. A few volts are in most cases sufficient, depending on measurement accuracy. Since the signal generation also depends on the absolute charging potential, which may be influenced by component material, a positive or negative DC-offset OS can be superimposed to the AC-signal by the AC-signal generator 9. Accordingly, the amplitude of the electrode signal can change symmetrically to ground, can have a more positive or negative portion, can start from zero in positive or negative polarity or can vary between positive or negative voltages as shown in FIG. 5.

The beam energy of the particle beam should be close to that beam energy at which the secondary particle yield of the component is 1. Preferably an electron beam is used as primary particle beam. Typical energies for electron beams are in the range of 500 eV to several keVs. But also other energies are possible.

Since the method described above is only looking for amplitude variations as a function of the frequency, it is insensitive to slow primary particle beam current changes and secondary particle yield variations. Therefore, it is an absolute and more reliable technique compared to the state of the art techniques. Since the measurement can be performed at only one location on the component and the frequency change can be performed vary rapidly (frequency sweep), it is also a very fast measurement method.

What is claimed is:

1. A method for testing an electrical component comprising the following steps of:
    positioning a primary particle beam onto the component,
    connecting an output of an AC-signal generator to an electrode being positioned in front of the component,
    detecting secondary particles released at the component and penetrating the electrode to form a secondary particle signal, and
    evaluating the secondary particle signal, by the following steps of;
        applying the AC-signal from the AC-signal generator to the electrode,
        varying a frequency of the AC-signal,
        and evaluating the corresponding secondary particle signal relatively to the AC-signal.

2. A method according to claim 1, wherein said step of evaluating the corresponding secondary particle signal is conducted with respect to an AC-amplitude variation and/or phase shift relatively to the AC-signal.

3. A method according to claim 1, wherein said step of varying the frequency of the AC-signal includes a step of increasing the frequency.

4. A method according to claim 1, wherein capacitance of the component is determined by evaluating the secondary particle signal.

5. A method according to claim 1, wherein RC-constants of the component are determined by evaluating the secondary particle signal.

6. A method according to claim 1, wherein opens and/or shorts of the component are determined by evaluating the secondary particle signal.

7. A method according to claim 1, wherein a positive or negative DC-offset is superimposed to the AC-signal.

8. A method according to claim 1, wherein an electron beam is used as said primary particle beam.

9. A system for testing an electrical component, comprising:

a particle beam column for irradiating a primary particle beam onto the component, an electrode arranged in front of the component, a detector for detecting secondary particles released at the component and penetrating the electrode to form a secondary particle signal, an evaluation unit for evaluating the secondary particle signal, an AC-signal generator for applying an AC-signal to the electrode, and varying the frequency of the AC-signal, wherein said evaluation unit evaluates said secondary particle signal with respect to an AC-amplitude variation and/or phase shift relatively to the AC-signal.

* * * * *